(12) United States Patent
Jeng (10) Patent No.: US 6,885,072 B1
(45) Date of Patent: Apr. 26, 2005

(54) NONVOLATILE MEMORY WITH UNDERCUT TRAPPING STRUCTURE

(75) Inventor: Erik S. Jeng, Taipei (TW)

(73) Assignee: Applied Intellectual Properties Co., Ltd., Taipei (TW)

( * ) Notice: Subject to any disclaimer, the term of this patent is extended or adjusted under 35 U.S.C. 154(b) by 0 days.

(21) Appl. No.: 10/715,931

(22) Filed: Nov. 18, 2003

(51) Int. Cl.[7] ................. H01L 29/76; H01L 29/94; H01L 31/062; H01L 31/113; H01L 31/119
(52) U.S. Cl. ................. 257/412; 257/327; 257/344; 257/387; 257/388
(58) Field of Search ................. 257/336, 344, 257/408

(56) References Cited

U.S. PATENT DOCUMENTS

| | | | | |
|---|---|---|---|---|
| 5,734,185 A | * | 3/1998 | Iguchi et al. | 257/336 |
| 6,180,978 B1 | * | 1/2001 | Chatterjee et al. | 257/327 |
| 6,399,469 B1 | * | 6/2002 | Yu | 438/595 |
| 6,482,691 B1 | * | 11/2002 | Wu et al. | 438/217 |
| 6,613,623 B1 | * | 9/2003 | Tsai et al. | 438/197 |
| 2002/0089021 A1 | * | 7/2002 | Ko | 257/408 |
| 2002/0132431 A1 | * | 9/2002 | Fung et al. | 438/300 |
| 2002/0142523 A1 | * | 10/2002 | Ryu et al. | 438/149 |
| 2003/0094662 A1 | * | 5/2003 | Bae et al. | 257/408 |

* cited by examiner

*Primary Examiner*—George Eckert
*Assistant Examiner*—Jesse A. Fenty
(74) *Attorney, Agent, or Firm*—Perkins Coie LLP (57) ABSTRACT

The present invention discloses a nonvolatile memory with undercut trapping structure, the nonvolatile memory comprising a semiconductor substrate. A gate oxide is formed on the semiconductor substrate. A gate structure is formed on the gate oxide, wherein the gate structure including a undercut structure formed at lower portion of the gate structure and inwardly into the gate structure. An isolation layer is formed over the sidewall of the gate structure. First spacers are formed on the sidewall of the isolation layer and filled into the undercut structure for storing carrier and source and drain regions formed adjacent to the gate structure and under the undercut structure. Salicide is formed on the gate structure and the source and drain regions.

28 Claims, 6 Drawing Sheets

NONVOLATILE MEMORY WITH UNDERCUT TRAPPING STRUCTURE

TECHNICAL FIELD

The present invention relates to a semiconductor device, and more specifically, to a nonvolatile memory with undercut structure capable of trapping carriers.

BACKGROUND

The semiconductor industry has been advanced to the field of Ultra Large Scale Integrated Circuit (ULSI) technologies. The fabrication of the nonvolatile memories also follows the trend of the reduction in the size of a device. The nonvolatile memories include various types of devices. Different types of devices have been developed for specific applications' requirements in each of these segments. Flash memory is one of the segments of nonvolatile memory devices. The device includes a floating gate to storage charges and an element for electrically placing charge in and removing the charges from the floating gate. One of the applications of flash memory is BIOS for computers. Typically, the high-density nonvolatile memories can be applied as the mass storage of portable handy terminals, solid-state camera and PC cards. It is because that the nonvolatile memories exhibit many advantages, such as memory retention without power, fast access time, low power dissipation in operation, and robustness.

The formation of nonvolatile memories toward the trends of low supply power and fast access, because these requirements are necessary for the application of the mobile computing system. Nonvolatile memory needs the charges to be hold in the floating gate for a long period of time. Therefore, the dielectric that is used for insulating the floating gate needs to be high quality in insulation and good durability in writing. At present, the low voltage nonvolatile memory is applied with a voltage of about 5V to 10V during charging or discharging the floating gate. As known in the art, the tunneling effect is a basic technology in charging or discharging. In order to attain high tunneling efficiency, the thickness of the dielectric between the floating gate and substrate have to be scaled down due to the supply voltage is reduced. The data program method of a non-volatile memory device includes a method using Fowler-Nordheim (FN) tunneling or a method using hot electron injection. In FN tunneling, a high voltage is applied to a control gate to induce a high electric field in a tunnel oxide layer, and electrons of a semiconductor substrate pass the tunnel oxide layer and are injected into a floating gate. During the mode of erasing, the bias may apply on the source to discharge the electron from the floating gate to the source of a memory device.

Currently, the SOC (system on chip) desires memory with high operation speed and integrated in one single chip. For example, the single polysilicon processing may integrate with other devices such as transistors. The typical nonvolatile memory employs stack gate memories by double polysilicon processing. One type of the memories uses trapping layer instead of floating gate (FG) to hold the carrier. The memory cells are constructed with a trapping ONO layer. The memory cell generally includes a P-type silicon substrate and two PN junctions between N+ source (or drain regions) and P type substrate, a nitride layer sandwiched between two oxide layers and a polycrystalline layer. To program or write the cell, voltages are applied to the drain and the gate and the source is grounded. These voltages generate an electric field along the length of the channel from the source to the drain. This electric field causes electrons to be drawn off the source and begin accelerating towards the drain. The hot electrons are generated at the boundary between drain and channel during the acceleration.

In the prior art, please refer to U.S. Pat. No. 4,881,108 U.S. Pat. No. 5,768,192 to Eitan B. entitled "Non-volatile semiconductor memory cell utilizing asymmetrical charge trapping", filed on 16 Jun. 1998. The charge trapping memory may also be referred to U.S. Pat. No. 6,335,554 to Yoshikawau and Kuniyoshi, entitled "Semiconductor Memory". The patent disclosed a memory with ONO structure. Further article teaches the memory with ONO stacked layer could also be found, please refer to the article, Chan, T. Y. et al, "A True Single-Transistor Oxide-Nitride-Oxide EEPROM Device," IEEE Electron Device Letters, vol. EDL-8. No. 3, March 1987.

SUMMARY

The object of the present invention is to disclose a nonvolatile memory with undercut structure capable of trapping carriers.

The present invention discloses a nonvolatile memory with undercut trapping structure, the nonvolatile memory comprising a semiconductor substrate. A gate oxide is formed on the semiconductor substrate. A gate structure is formed on the gate oxide, wherein the gate structure including an undercut structure formed at lower portion of the gate structure and inwardly into the gate structure. An isolation layer is formed on the sidewall of the gate structure. First spacers are formed on the sidewall of the isolation layer and filled into the undercut structure for storing carrier and source and drain regions formed adjacent to the gate structure and under the undercut structure. Salicide is formed on the gate structure and the source and drain regions.

The nonvolatile memory further comprises pocket ion implantation region located adjacent to the source and drain regions and under the undercut structure, wherein the conductive type of the pocket ion implantation region is opposite to the one of the source and drain regions. Alternatively, the nonvolatile memory further includes lightly doped drain region adjacent to the source and drain regions and under the undercut structure, wherein the junction of the lightly doped drain region is shallower than the one of the source and drain regions and the lightly doped drain region is closer to the channel under the gate structure than the source and drain regions; and pocket ion implantation region adjacent to the source and drain regions, wherein the conductive type of the pocket ion implantation region is opposite to the one of the source and drain regions. Further embodiment, the nonvolatile memory further comprises double doped drain region adjacent to the source and drain regions and under the undercut structure, wherein the junction of the double doped drain region is deeper than the one of the source and drain regions and the double doped drain region is closer to the channel under the gate structure than the source and drain regions; and pocket ion implantation region adjacent to the double doped drain region and under the undercut structure, wherein the conductive type of the pocket ion implantation region is opposite to the one of the source and drain regions.

Wherein the first spacer or the material filled into the undercut structure includes nitride or the materials having energy gap lower than 6 eV. The present invention may further include second spacers attached on the first spacers, wherein the second spacers are formed of oxide or the material having energy gap larger than 7 eV. The isolation layer is formed of oxide or the material having energy gap larger than 7 eV. Wherein the silicide material includes $TiSi_2$, $CoSi_2$ or NiSi.

The present invention discloses a nonvolatile memory with undercut trapping structure, the nonvolatile memory comprising a semiconductor substrate; a gate oxide formed on the semiconductor substrate. A gate structure is formed on the gate oxide, wherein the gate structure includes an undercut structure formed at lower portion of the gate structure and inwardly extends into the gate structure, wherein the gate structure comprises a stacked structure including of polysilsicon layer/silicide layer and a first dielectric layer. A second dielectric layer is formed over the sidewall of the gate structure. First spacers are formed on the sidewall of the second dielectric layer and filled into the undercut structure for storing carrier and source and drain regions formed adjacent to the gate structure and under the undercut structure.

The present invention further comprises pocket ion implantation region located adjacent to the source and drain regions and under the undercut structure, wherein the conductive type of the pocket ion implantation region is opposite to the one of the source and drain regions. Alternatively, the nonvolatile memory further comprises lightly doped drain region adjacent to the source and drain regions and under the undercut structure, wherein the junction of the lightly doped drain region is shallower than the one of the source and drain regions and the light doped drain region is closer to the channel under the gate structure than the source and drain regions; and pocket ion implantation region adjacent to the source and drain regions, wherein the conductive type of the pocket ion implantation region is opposite to the one of the source and drain regions. In another preferred embodiment, the present invention further comprises double doped drain region adjacent to the source and drain regions and under the undercut structure, wherein the junction of the double doped drain region is deeper than the one of the source and drain regions and the double doped drain region is closer to the channel under the gate structure than the source and drain regions; and pocket ion implantation region adjacent to the double doped drain region and under the undercut structure, wherein the conductive type of the pocket ion implantation region is opposite to the one of the source and drain regions.

Wherein the first spacers or the material filled into the undercut structure includes nitride or the material has energy gap lower than 6 eV. The nonvolatile memory may further comprise second spacers attached on the first spacers, wherein the second spacers are formed of oxide or the material having energy gap larger than 7 eV. The second dielectric layer later is formed of oxide or the material having energy gap larger than 7 eV. The first spacers are formed of nitride or the material having energy gap lower than 6 eV. The silicide material includes $TiSi_2$, $CoSi_2$ or NiSi. Further, the first dielectric layer is formed of oxide or nitride or the combination of oxide and nitride layers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

The present invention proposes a novel structure for charge trapping nonvolatile memory. In the structure, the cell capacity for storing data can be increased by the cell structure. The detail description will be seen as follows. A semiconductor substrate is provided for the present invention. In a preferred embodiment, as shown in the FIG. 1, a single crystal silicon substrate 2 with a <100> or <111> crystallographic orientation is provided. The substrate 2 includes a pattern of active areas. The isolation to separate the devices includes STI or FOX. A thin dielectric layer 4 consisted of silicon dioxide is formed on the substrate 2 to act as gate oxide. Typically, the layer 4 can be grown in oxygen ambient at a temperature of about 700 to 1100 degrees centigrade. Other method, such as chemical vapor deposition, can also form the oxide. In the embodiment, the thickness of the silicon dioxide layer 4 is approximately 15–250 angstroms. Subsequently, a conductive layer 6 is formed on the layer 4. The conductive layer 4 may be formed of doped polysilicon, in-situ doped polysilicon or epitaxy silicon. For an embodiment, the doped polysilicon layer 6 is doped by phosphorus using a $PH_3$ source. A photo-resist defined patterning process is used on the conductive layer 6, thereby forming the gate structure on the silicon substrate 2. It has to be noted that the gate structure includes undercut structure 8 located at lower portion of the gate and inwardly formed into the gate 6. Please refer to FIG. 1, an isolation layer 10 is conformally formed on the substrate 2 and the gate structure 6. The material for forming the isolation layer 10 can be oxide ($SiO_2$) or ($HfO_2$) or the material with energy gap higher than 7 eV. One suitable method for the oxide layer 10 includes thermal oxidation and deposition by CVD. For example, Low Pressure Chemical Vapor Deposition (LPCVD), Plasma Enhance Chemical Vapor Deposition (PECVD), High Density Plasma Chemical Vapor Deposition (HDPCVD). Still referring to FIG. 1, an isotropic etching is performed to create sidewall spacers 12 on the sidewall of the isolation layer 10. Reactive ion etching (RIE) or plasma etching is the typical way to achieve the purpose. The spacers 12 also fill into the undercut structure 8, thereby forming the ON structure capable of trapping carriers to define the digital states. The material for the spacer could be nitride or the material with energy gap smaller than 6 eV. In the preferred embodiment, the reaction gases of the step to form silicon nitride layer include, for example, SiH4, NH3, $N_2$ or $SiH_2Cl_2$, $NH_3$, $N_2$.

Figure 1:
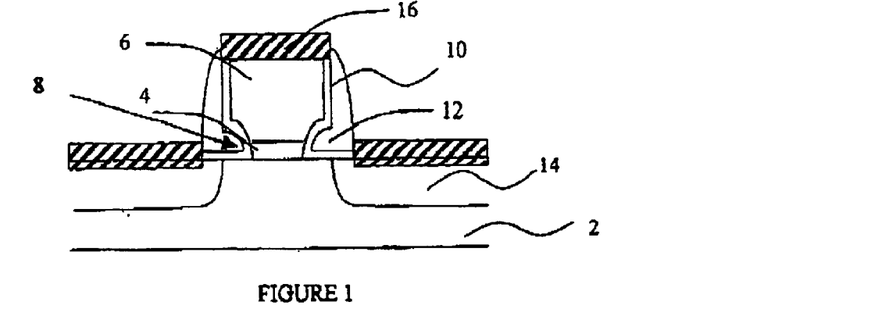
FIG. 1 is a cross sectional view of a semiconductor wafer illustrating the first embodiment according to the present invention.

Turning to FIG. 1, the source and drain region 14 is formed by performing an ion implantation to dope ions into the substrate 2 using the gate structure 6 and sidewall spacers 12 as a mask. After selectively etching isolation layer 10, portions of the gate 6 and substrate 2 are exposed. Silicide 16 is introduced on the exposed surface of the top portion of gate and the silicon substrate 2 on the source and drain regions 14 to reduce their resistance. Preferably, the silicide 16 can be TiSi2, CoSi2 or NiSi. The gate structure 6 acts as the control gate, and the nitride spacers are used to trap carriers. The spacers 12 may be used to store charges, thereby defining the digital states including (0, 0), (0, 1), (1, 0), (1, 1). A sectional view of a multi-bit nonvolatile memory cell in accordance with the present invention is shown in FIGS. 1–24. The memory cell includes a substrate 2 having at least two buried PN junctions, one is the left junction and the other is the right junction. Channels are located between the two junctions during operation. Above the main channel is an oxide 4, on top of the oxide layer 4 is a control gate 6. Spacer 12 is used for charge trapping and is preferably comprised of silicon nitride. The hot electrons or holes are trapped as they are injected into the Spacer 12 from the injection portion near source/drain to channel junction throughout the isolation layer 10 over the substrate 2.

The memory cell is capable of storing two bits of data, a right bit and a left bit. The two bit memory cell is a symmetrical device. The left junction serves as the source terminal and the right junction serves as the drain terminal for the right bit programming. Similarly, for the left bit programming, the right junction serves as the source terminal and the left junction serves as the drain terminal. When the distinction between left and right bits is not crucial to the particular discussion, the terms source and drain are utilized as conventional manner.

Figure 2:
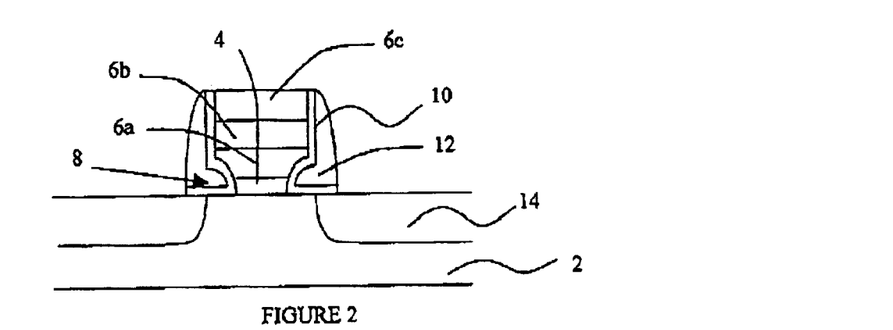
FIG. 2 is a cross sectional view of a semiconductor wafer illustrating the second embodiment according to the present invention.

FIG. 2 illustrates the second embodiment of the present invention. Most of the parts are similar to the first embodiment, the difference between both includes that the example omits the salicide 16 at source and drain regions in the second embodiment. The gate is consisted of polysilicon 6a, silicide 6b and dielectric layer 6c. The silicide 6b is preferably formed of WSi and TiSi2. The dielectric layer 6c is formed of oxide, nitride or the combinations of oxide and nitride layers.

Figure 3:
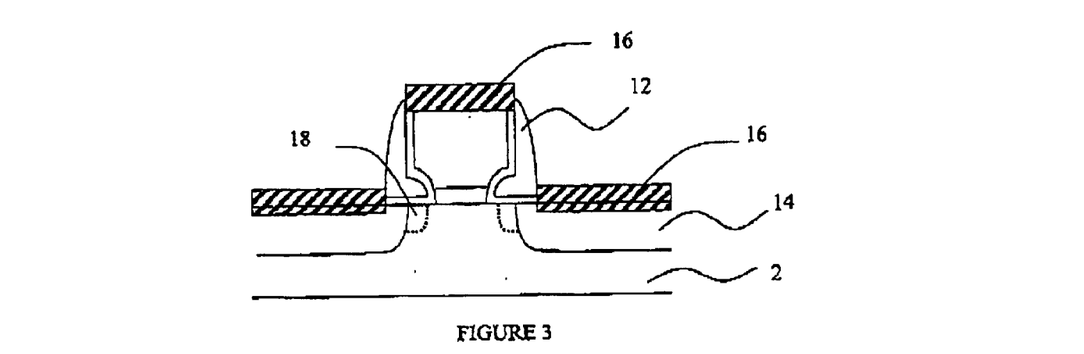
FIG. 3 is a cross sectional view of a semiconductor wafer illustrating the third embodiment according to the present invention.
Figure 4:
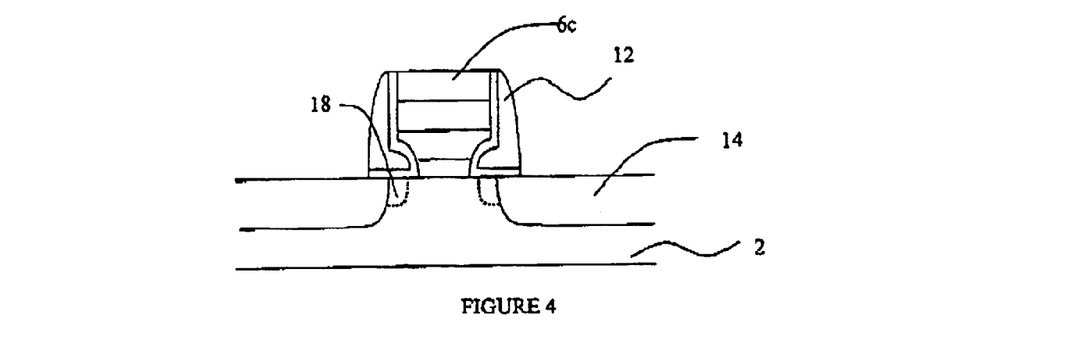
FIG. 4 is a cross sectional view of a semiconductor wafer illustrating the forth embodiment according to the present invention.

Turning to FIG. 3, the embodiment includes pocket ion implantation region 18 adjacent to the source and drain region 14 and under the undercut structure 8 to reduce the short channel effect and increase the efficiency of the hot carrier injection. FIG. 4 shows the alterative example for the present invention, it is similar to the second embodiment. It also includes pocket ion implantation region 18 adjacent to the source and drain region 14. The conductive type of the pocket implant region 18 is opposite to the one of the source and drain region 14.

Figure 5:
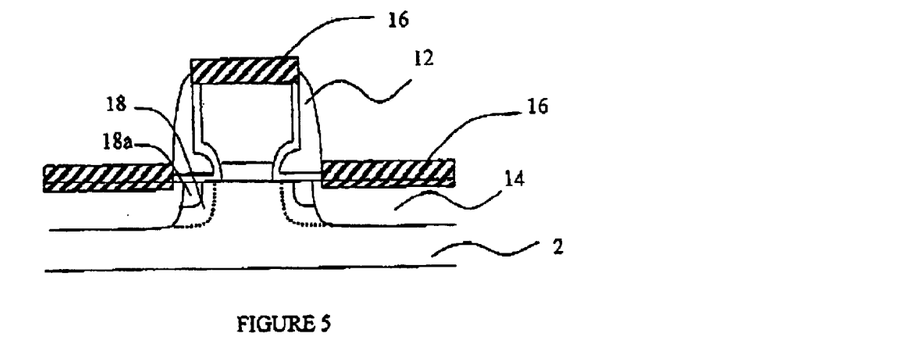
FIG. 5 is a cross sectional view of a semiconductor wafer illustrating the fifth embodiment according to the present invention.
Figure 6:
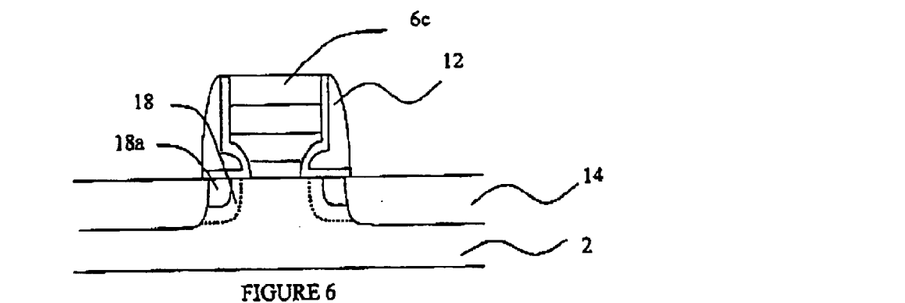
FIG. 6 is a cross sectional view of a semiconductor wafer illustrating the sixth embodiment according to the present invention.
Figure 7:
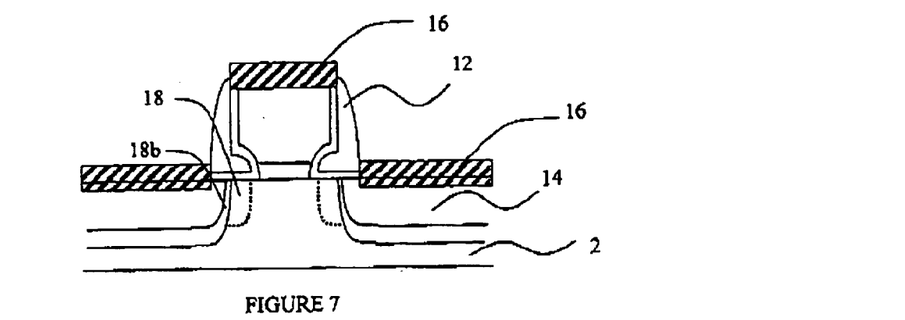
FIG. 7 is a cross sectional view of a semiconductor wafer illustrating the seventh embodiment according to the present invention.
Figure 8:
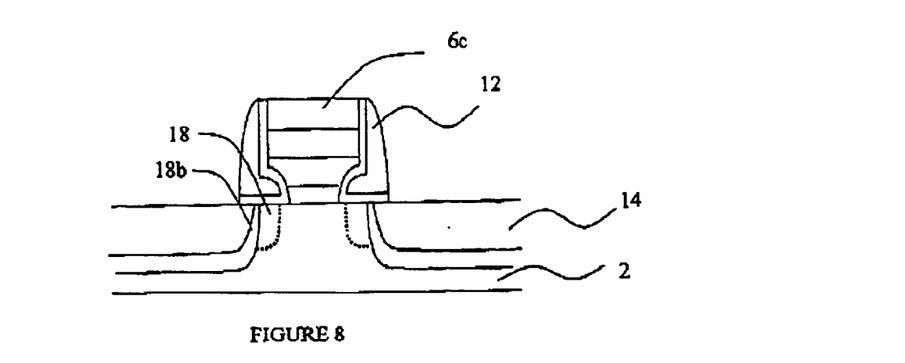
FIG. 8 is a cross sectional view of a semiconductor wafer illustrating the eighth embodiment according to the present invention.

FIGS. 5 and 6 are the alternative approachs with respect to the embodiments shown in FIGS. 3 and 4. The fifth and sixth embodiments introduce the lightly doped drain to control the hot carriers and further comprise pocket ion implant region 18 adjacent to the source and drain region 14 and under the undercut structure 8. The conductive type of the pocket ion implantation region is opposite to the one of the source and drain region. The junction of the lightly doped drain is shallower than the one of the source and drain region. The lightly doped drain is also closer to the channel under the gate. Alternatively, the other embodiments shown in FIGS. 7 and 8 introduce the usage of double diffused drain (DDD) structure to reduce the junction breakdown effect. The conductive ion type of the DDD structure is the same as that of the source and drain region. However, the junctions of the lightly doped regions are deeper than the junctions of the heavily doped source and drain region. The embodiments further comprise pocket ion implant region adjacent to the double diffused source and drain region and under the undercut structure 8 of the control gate 6.

Figure 9:
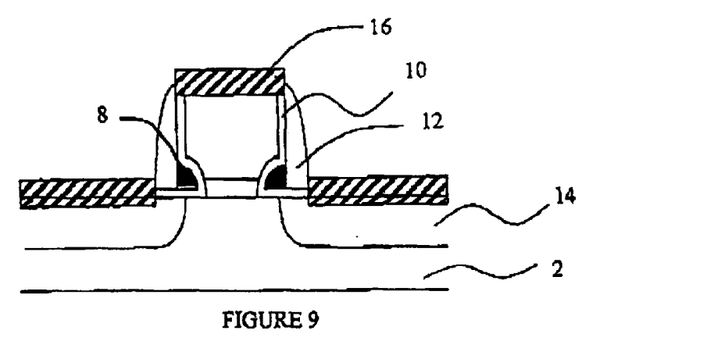
FIG. 9 is a cross sectional view of a semiconductor wafer illustrating the ninth embodiment according to the present invention.
Figure 10:
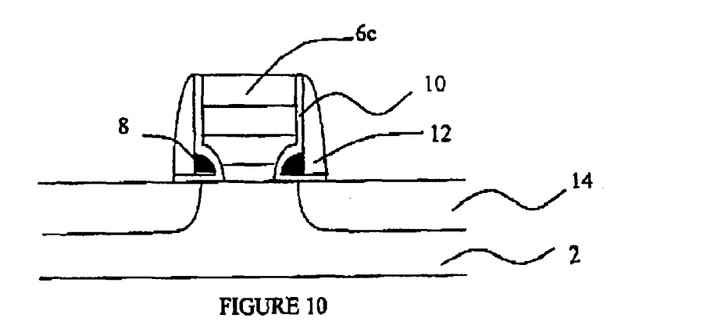
FIG. 10 is a cross sectional view of a semiconductor wafer illustrating the tenth embodiment according to the present invention.
Figure 11:
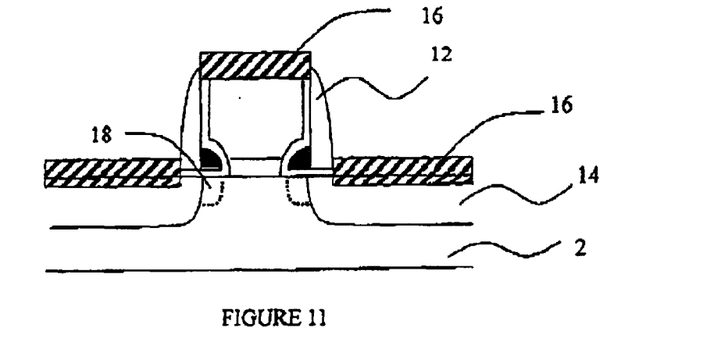
FIG. 11 is a cross sectional view of a semiconductor wafer illustrating the eleventh embodiment according to the present invention.
Figure 12:
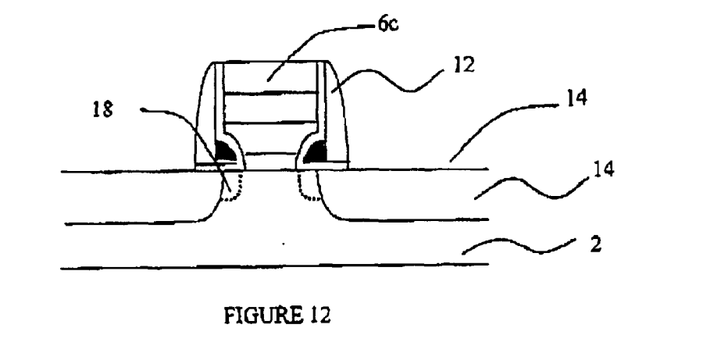
FIG. 12 is a cross sectional view of a semiconductor wafer illustrating the twelfth embodiment according to the present invention.
Figure 13:
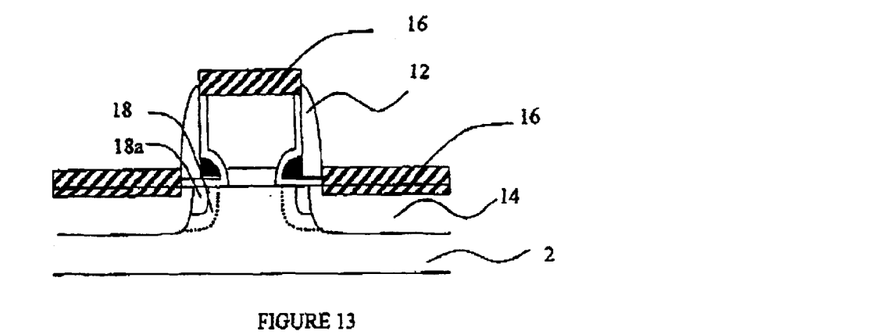
FIG. 13 is a cross sectional view of a semiconductor wafer illustrating the thirteenth t embodiment according to the present invention.
Figure 14:
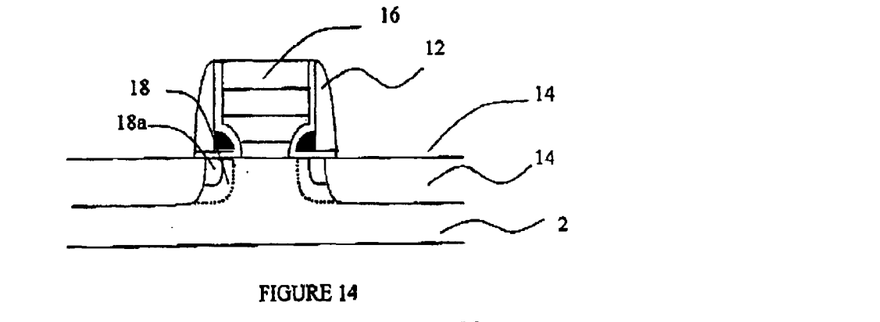
FIG. 14 is a cross sectional view of a semiconductor wafer illustrating the fourteenth embodiment according to the present invention.
Figure 15:
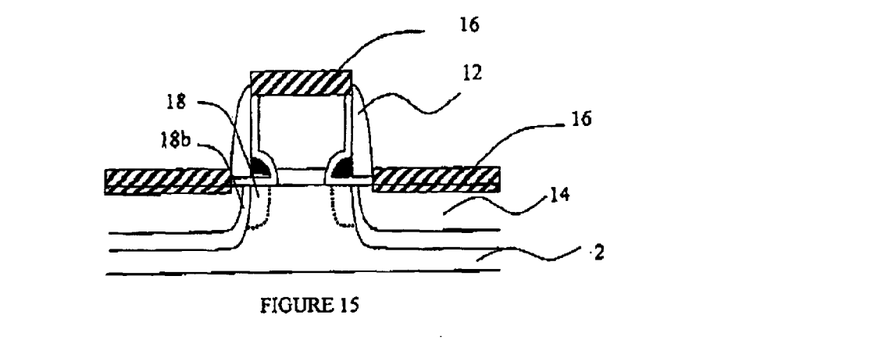
FIG. 15 is a cross sectional view of a semiconductor wafer illustrating the fifteenth embodiment according to the present invention.
Figure 16:
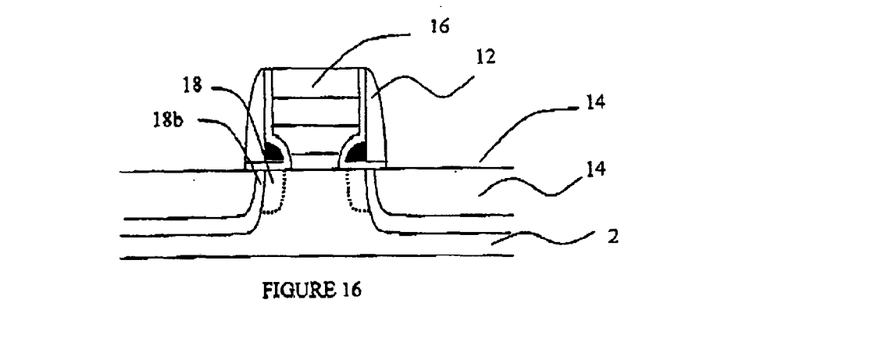
FIG. 16 is a cross sectional view of a semiconductor wafer illustrating the sixteenth embodiment according to the present invention.
Figure 17:
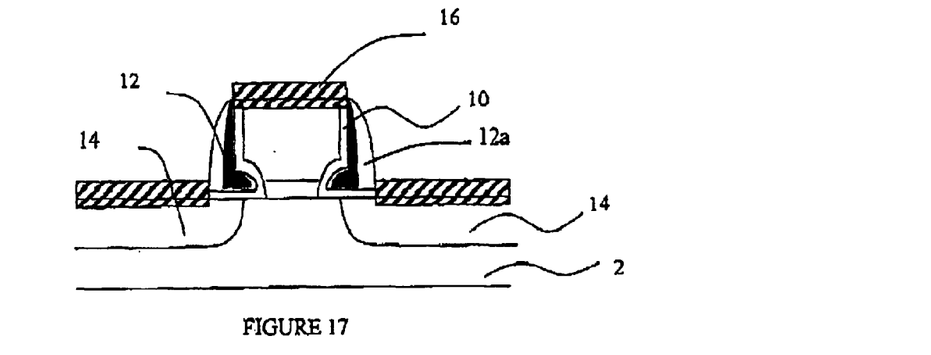
FIG. 17 is a cross sectional view of a semiconductor wafer illustrating the seventeenth embodiment according to the present invention.
Figure 18:
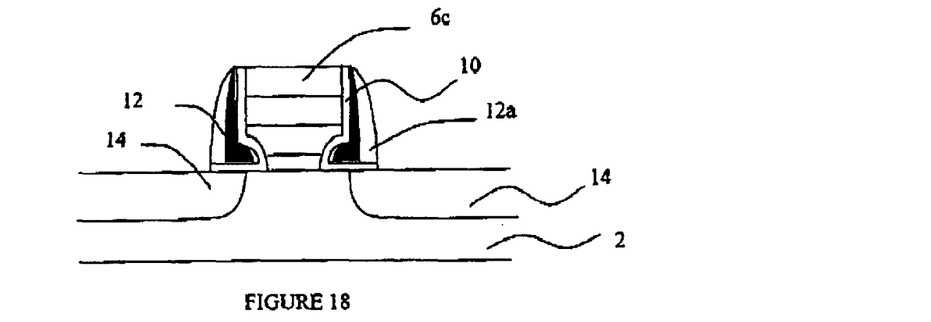
FIG. 18 is a cross sectional view of a semiconductor wafer illustrating the eighteenth embodiment according to the present invention.
Figure 19:
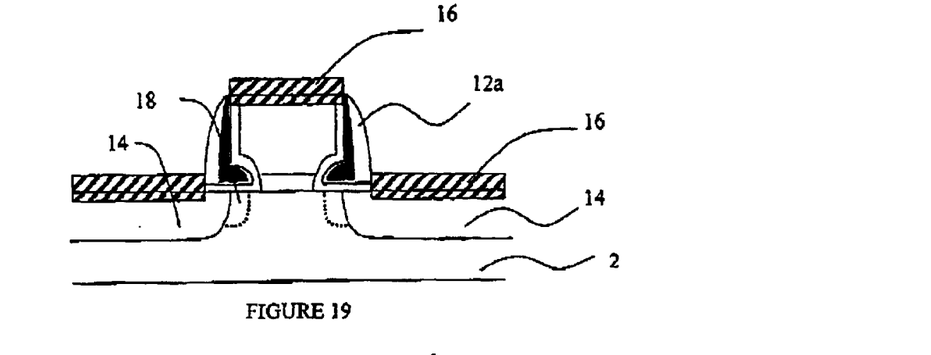
FIG. 19 is a cross sectional view of a semiconductor wafer illustrating the nineteenth embodiment according to the present invention.
Figure 20:
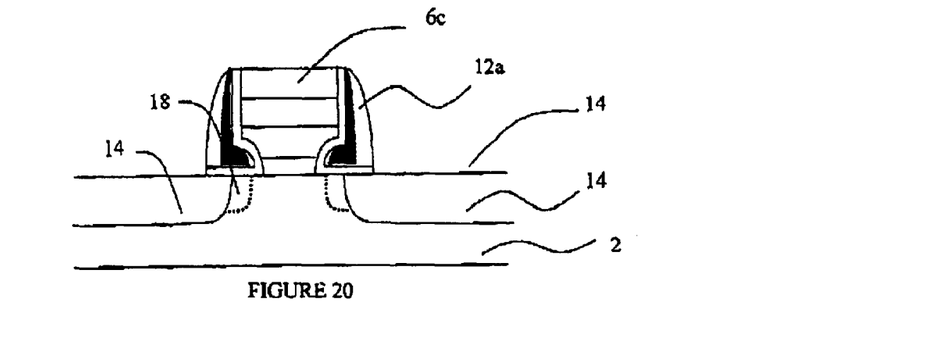
FIG. 20 is a cross sectional view of a semiconductor wafer illustrating the twentieth embodiment according to the present invention.
Figure 21:
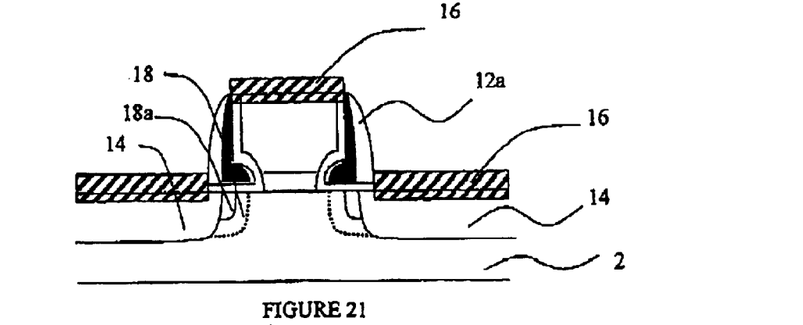
FIG. 21 is a cross sectional view of a semiconductor wafer illustrating the twenty-first embodiment according to the present invention.
Figure 22:
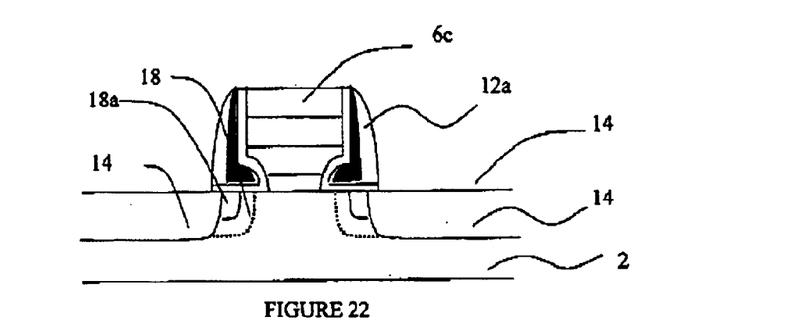
FIG. 22 is a cross sectional view of a semiconductor wafer illustrating the twenty-second embodiment according to the present invention.
Figure 23:
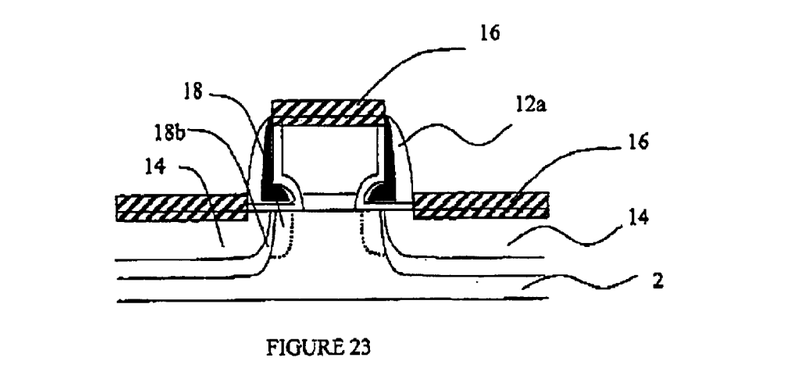
FIG. 23 is a cross sectional view of a semiconductor wafer illustrating the twenty-third embodiment according to the present invention.
Figure 24:
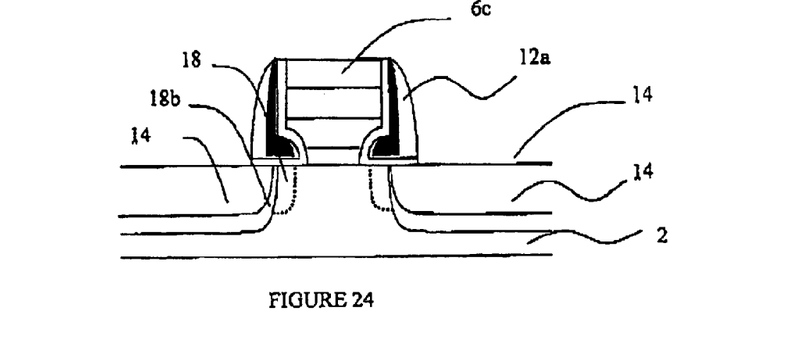
FIG. 24 is a cross sectional view of a semiconductor wafer illustrating the twenty-fourth embodiment according to the present invention.

Please refer to FIG. 9, the example is similar to the first embodiment except the spacer 12 is formed of oxide and the undercut is filled with nitride material in the ninth preferred embodiment, thereby storing carriers to define the digital state. Similarly, the preferred embodiments from FIGS. 10–16 are the alternative solutions for the corresponding examples from FIGS. 2–8. The corresponding structures and features are the same except the undercut is filled with nitride and the space is replaced by oxide material.

Next, the embodiments shown in FIGS. 17–24 are the alternative arrangements that are associated with FIGS. 1–6, correspondingly. The main different is that the double-spacers structure is introduced into the embodiments shown in FIGS. 17–24. The material for the fist spacer and material filled into the undercut structure is nitride. The second spacer 12a is attached on the first spacer, the second spacer is formed of the material having energy gap larger than 7 eV. The configuration, therefore, constructs the ONO structure.

In the illustrations of the present invention, form the direction parallel to the surface of the paper, two spacers are located adjacent to the gate, hence, two-bits may be stored in the two nitride spacers, and other two bits could be stored in the two further nitride spacers, the two nitride spacers (not shown in the figures) could be observed from the direction perpendicular to the surface of the paper. Therefore, the present invention provides a multi-bit device for storing multi-bits digital signal. The trapping layer is formed of ONO or ON configuration to trap the carrier, thereby defining the digital states.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures. While the preferred embodiment of the invention has been illustrated and described, it will be appreciated that various changes can be made therein without departing from the spirit and scope of the invention.

I claim:

1. A nonvolatile memory with undercut trapping structure, said nonvolatile memory comprising:
   a semiconductor substrate;
   a gate oxide formed on said semiconductor substrate;
   a gate structure formed on said gate oxide, wherein said gate structure including a undercut structure formed at lower portion of the gate structure and inwardly into said gate structure;
   an isolation layer formed over the sidewall of said gate structure;
   first spacers formed on the sidewall of said isolation layer and filled into said undercut structure for storing carriers;
   source and drain regions formed adjacent to said gate structure and under said undercut structure; and
   double doped drain region adjacent to said source and drain regions and under said undercut structure, wherein the junction of said double doped drain region is deeper than the one of said source and drain regions and said double doped drain region is closer to the channel under said gate structure than said source and drain regions; and
   pocket ion implantation region located adjacent to said source and drain regions and under said undercut structure, wherein the conductive type of the pocket ion implantation region is opposite to the one of the source and drain regions.

2. The nonvolatile memory of claim 1, wherein the undercut-filling material filled into said undercut structure includes nitride or the material having energy gap lower than 6 eV, said first spacers attached onto the sidewall of said gate is formed of oxide or the material having energy gap larger than 7 eV.

3. The nonvolatile memory of claim 1, further comprising second spacers attached on said first spacers, wherein said second spacers is formed of oxide or the material having energy gap larger than 7 eV.

4. A nonvolatile memory with undercut trapping structure, said nonvolatile memory comprising:
   a semiconductor substrate;
   a gate oxide formed on said semiconductor substrate;
   a gate structure formed on said gate oxide, wherein said gate structure including a undercut structure formed at lower portion of the gate structure and inwardly into said gate structure;
   an isolation layer formed over the sidewall of said gate structure;
   first spacers formed on the sidewall of said isolation layer and filled into said undercut structure for storing carriers;
   source and drain regions formed adjacent to said gate structure and under said undercut structure; and
   pocket ion implantation region adjacent to said double doped drain region and under said undercut structure, wherein the conductive type of the pocket ion implantation region is opposite to the one of the source and drain regions, wherein the undercut-filling material filled into said undercut structure includes nitride or the material having energy gap lower than 6 eV, said first spacers attached onto the sidewall of said gate is formed of oxide or the material having energy gap larger than 7 eV.

5. The nonvolatile memory of claim 4, further comprising second spacers attached on said first spacers, wherein said second spacers are formed of oxide or the material having energy gap larger than 7 eV.

6. A nonvolatile memory with undercut trapping structure, said nonvolatile memory comprising:
   a semiconductor substrate;
   a gate oxide formed on said semiconductor substrate;
   a gate structure formed on said gate oxide, wherein said gate structure including a undercut structure formed at lower portion of the gate structure and inwardly into said gate structure;
   an isolation layer formed over the sidewall of said gate structure;
   first spacers formed on the sidewall of said isolation layer and filled into said undercut structure for storing carriers;
   source and drain regions formed adjacent to said gate structure and under said undercut structure; and
   lightly doped drain region adjacent to said source and drain regions and under said undercut structure, wherein the junction of said lightly doped drain region is shallower than the one of said source and drain regions and said lightly doped drain region is closer to the channel under said gate structure than said source and drain regions; and
   pocket ion implantation region located adjacent to said source and drain regions and under said undercut structure, wherein the conductive type of the pocket ion implantation region is opposite to the one of the source and drain regions, wherein the undercut-filling material filled into said undercut structure includes nitride or the material having energy gap lower than 6 eV, said first spacers attached onto the sidewall of said gate is formed of oxide or the material having energy gap larger than 7 eV.

7. The nonvolatile memory of claim 6, further comprising second spacers attached on said first spacers, wherein said second spacers is formed of oxide or the material having energy gap larger than 7 eV.

8. A nonvolatile memory with undercut trapping structure, said nonvolatile memory comprising:
- a semiconductor substrate;
- a gate oxide formed on said semiconductor substrate;
- a gate structure formed on said gate oxide, wherein said gate structure including a undercut structure formed at lower portion of the gate structure and inwardly into said gate structure, wherein said gate structure comprising a stacked structure including of polysilsicon layer/silicide layer and a first dielectric layer;
- a second dielectric layer formed over the sidewall of said gate structure;
- first spacers formed on the sidewall of said second dielectric layer and filled into said undercut structure for storing carriers; and
- source and drain regions formed adjacent to said gate structure and under said undercut structure; and
- pocket ion implantation region located adjacent to said source and drain regions and under said undercut structure, wherein the conductive type of the pocket ion implantation region is opposite to the one of the source and drain regions, wherein the undercut-filling material filled into said undercut structure includes nitride or the material having energy gap lower than 6 eV, said first spacers attached onto the sidewall of said gate is formed of oxide or the material having energy gap larger than 7 eV.

9. The nonvolatile memory of claim 8, further comprising second spacers attached on said first spacers, wherein said second spacers is formed of oxide or the material having energy gap larger than 7 eV.

10. A nonvolatile memory with undercut trapping structure, said nonvolatile memory comprising:
- a semiconductor substrate;
- a gate oxide formed on said semiconductor substrate;
- a gate structure formed on said gate oxide, wherein said gate structure including a undercut structure formed at lower portion of the gate structure and inwardly into said gate structure, wherein said gate structure comprising a stacked structure including of polysilsicon layer/silicide layer and a first dielectric layer;
- a second dielectric layer formed over the sidewall of said gate structure;
- first spacers formed on the sidewall of said second dielectric layer and filled into said undercut structure for storing carriers; and
- source and drain regions formed adjacent to said gate structure and under said undercut structure;
- lightly doped drain region adjacent to said source and drain regions and under said undercut structure, wherein the junction of said lightly doped drain region is shallower than the one of said source and drain regions and said lightly doped drain region is closer to the channel under said gate structure than said source and drain regions; and
- pocket ion implantation region adjacent to said lightly doped drain regions, wherein the conductive type of the pocket ion implantation region is opposite to the one of the source and drain regions, wherein the undercut-filling material filled into said undercut structure includes nitride or the material having energy gap lower than 6 eV, said first spacers attached onto the sidewall of said gate is formed of oxide or the material having energy gap larger than 7 eV.

11. The nonvolatile memory of claim 10, further comprising second spacers attached on said first spacers, wherein said second spacers is formed of oxide or the material having energy gap larger than 7 eV.

12. A nonvolatile memory with undercut trapping structure, said nonvolatile memory comprising:
- a semiconductor substrate;
- a gate oxide formed on said semiconductor substrate;
- a gate structure formed on said gate oxide, wherein said gate structure including a undercut structure formed at lower portion of the gate structure and inwardly into said gate structure, wherein said gate structure comprising a stacked structure including of polysilsicon layer/silicide layer and a first dielectric layer;
- a second dielectric layer formed over the sidewall of said gate structure;
- first spacers formed on the sidewall of said second dielectric layer and filled into said undercut structure for storing carriers; and
- source and drain regions formed adjacent to said gate structure and under said undercut structure;
- double doped drain region adjacent to said source and drain regions and under said undercut structure, wherein the junction of said double doped drain region is deeper than the one of said source and drain regions and said double doped drain region is closer to the channel under said gate structure than said source and drain regions; and
- pocket ion implantation region adjacent to said double doped drain regions, wherein the conductive type of the pocket ion implantation region is opposite to the one of the source and drain regions, wherein the undercut-filling material filled into said undercut structure includes nitride or the material having energy gap lower than 6 eV, said first spacers attached onto the sidewall of said gate is formed of oxide or the material having energy gap larger than 7 eV.

13. The nonvolatile memory of claim 12, further comprising second spacers attached on said first spacers, wherein said second spacers is formed of oxide or the material having energy gap larger than 7 eV.

14. A nonvolatile memory with undercut trapping structure, said nonvolatile memory comprising:
- a semiconductor substrate;
- a gate oxide formed on said semiconductor substrate;
- a gate structure formed on said gate oxide, wherein said gate structure including a undercut structure formed at lower portion of the gate structure and inwardly into said gate structure;
- an isolation layer formed over the sidewall of said gate structure;
- first spacers formed on the sidewall of said isolation layer and filled into said undercut structure for storing carriers;
- source and drain regions formed adjacent to said gate structure and under said undercut structure;

wherein the undercut-filling material filled into said undercut structure includes nitride or the material having energy gap lower than 6 eV, said first spacers attached onto the sidewall of said gate is formed of oxide or the material having energy gap larger than 7 eV; and further comprising a double doped drain region adjacent to said source and drain regions and under said undercut structure, wherein the junction of said double doped drain region is deeper than the one of said source and drain regions and said double doped region is closer to the channel under said gate structure than said source and drain regions.

15. The nonvolatile memory of claim 14, further comprising pocket ion implantation region adjacent to said double doped drain region and under said undercut structure, wherein the conductive type of the pocket ion implantation region is opposite to the one of the source and drain regions.

16. The nonvolatile memory of claim 14, further comprising lightly doped drain region adjacent to said source and drain regions and under said undercut structure, wherein the junction of said lightly doped drain region is shallower than the one of said source and drain regions and said lightly doped drain region is closer to the channel under said gate structure than said source and drain regions.

17. The nonvolatile memory of claim 14, further comprising second spacers attached on said first spacers, wherein said second spacers are formed of oxide or the material having energy gap larger than 7 eV.

18. A nonvolatile memory with undercut trapping structure, said nonvolatile memory comprising:
    a semiconductor substrate;
    a gate oxide formed on said semiconductor substrate;
    a gate structure formed on said gate oxide, wherein said gate structure including a undercut structure formed at lower portion of the gate structure and inwardly into said gate structure, wherein said gate structure comprising a stacked structure including of polysilsicon layer/silicide layer and a first dielectric layer;
    a second dielectric layer formed over the sidewall of said gate structure;
    first spacers formed on the sidewall of said second dielectric layer and filled into said undercut structure for storing carriers; end
    source and drain regions formed adjacent to said gate structure and under said undercut structure;
    wherein the undercut-filling material filled into said undercut structure includes nitride or the material having energy gap lower than 6 eV, said first spacers attached onto the sidewall of said gate is formed of oxide or the material having energy gap larger than 7 eV; and
    further comprising a double doped drain region adjacent to said source and drain regions and under said undercut structure, wherein the junction of said double doped drain region is deeper than the one of said source and drain regions and said double doped drain region is loser to the channel under said gate structure than said source and drain regions.

19. The nonvolatile memory of claim 18, further comprising pocket ion implantation region adjacent to said double doped drain region and under said undercut structure, wherein the conductive type of the pocket ion implantation region is opposite to the one of the source and drain regions.

20. The nonvolatile memory of claim 18, further comprising lightly doped drain region adjacent to said source and drain regions and under said undercut structure, wherein the junction of said lightly doped drain region is shallower than the one of said source and drain regions and said lightly doped drain region is closer to the channel under said gate structure than said source and drain regions.

21. The nonvolatile memory of claim 18, further comprising second spacers attached on said first spacers, wherein said second spacers are formed of oxide or the material having energy gap larger than 7 eV.

22. A nonvolatile memory with undercut trapping structure, said nonvolatile memory comprising:
    a semiconductor substrate;
    a gate oxide formed on said semiconductor substrate;
    a gate structure formed on said gate oxide, wherein said gate structure including a undercut structure formed at lower portion of the gate structure and inwardly into said gate structure;
    an isolation layer formed over the sidewall of said gate structure;
    first spacers formed on the sidewall of said isolation layer and filled into said undercut structure for storing carried;
    source and drain regions formed adjacent to said gate structure and under said undercut structure;
    salicide formed on said gate structure and said source and drain regions;
    double doped drain region adjacent to said source and drain regions and under said undercut structure, wherein the junction of said double doped drain region is deeper than the one of said source and drain regions and said double doped drain region is closer to the channel under said gate structure than said source and drain regions; and
    pocket ion implantation region located adjacent to said source and drain regions and under said undercut structure, wherein the conductive type of the pocket ion implantation region is opposite to the one of the source and drain regions; wherein said isolation layer is formed of oxide or the material having energy gap larger than 7 eV.

23. The nonvolatile memory of claim 22, wherein said first spacers are formed of nitride or the material having energy gap lower than 6 eV.

24. The nonvolatile memory of claim 22, wherein said silicide material includes $TiSi_2$, $CoSi_2$ or $NiSi$.

25. A nonvolatile memory with spacer rapping structure, said nonvolatile memory comprising:
    a semiconductor substrate;
    a gate oxide formed on said semiconductor substrate;
    a gate structure formed on said gate oxide, wherein said gate structure comprises a stacked structure including of polysilsicon layer/silicide layer and a first dielectric layer;
    a second dielectric layer formed on the sidewall of said gate structure and the surface of said semiconductor substrate;
    first spacers formed on the sidewall of said second dielectric layer;
    source and drain regions formed adjacent to said gate structure, wherein p-n junctions of said source and drain regions formed under said first spacers;
    double doped drain region adjacent to said source and drain regions, wherein the p-n junctions of said double doped drain region are formed under said first spacers and the junction of said double doped drain region being deeper than the one of said source and drain regions, said double doped drain region being closer to the channel under said gate structure than said source and drain regions and the doping concentration of said double doped drain region is lower than the one of said source and drain regions;

pocket ion implantation region adjacent to said double doped drain region, the conductive type of the pocket ion implantation region being opposite to the one of the source and drain regions; and wherein said wherein said second dielectric layer is formed of oxide or the material having energy gap larger than 7 eV.

26. The nonvolatile memory of claim 25, wherein said first spacers are formed of nitride or the material having energy gap tower than 6 eV.

27. The nonvolatile memory of claim 25, wherein said silicide material includes TiSi2, WSi2, CoSi2 or NiSi.

28. The nonvolatile memory of claim 25, wherein said first dielectric layer is formed of oxide, nitride or the combination of oxide and nitride layers.

* * * * *

UNITED STATES PATENT AND TRADEMARK OFFICE
CERTIFICATE OF CORRECTION

PATENT NO. : 6,885,072 B1
DATED : April 26, 2006
INVENTOR(S) : Erik S. Jeng

It is certified that error appears in the above-identified patent and that said Letters Patent is hereby corrected as shown below:

Column 11,
Line 45, "end" should be -- and --;

Column 12,
Line 23, "carried" should be -- carries --;

Column 14,
Line 6, "tower" should be -- lower --.

Signed and Sealed this

Eighteenth Day of October, 2005

JON W. DUDAS
*Director of the United States Patent and Trademark Office*

UNITED STATES PATENT AND TRADEMARK OFFICE
CERTIFICATE OF CORRECTION

PATENT NO. : 6,885,072 B1
DATED : April 26, 2005
INVENTOR(S) : Erik S. Jeng

It is certified that error appears in the above-identified patent and that said Letters Patent is hereby corrected as shown below:

Column 11,
Line 45, "end" should be -- and --;

Column 12,
Line 23, "carried" should be -- carries --;

Column 14,
Line 6, "tower" should be -- lower --.

This certificate supersedes Certificate of Correction issued October 18, 2005.

Signed and Sealed this

Twenty-eighth Day of March, 2006

JON W. DUDAS
*Director of the United States Patent and Trademark Office*